United States Patent [19]
Lillja et al.

[11] Patent Number: 6,017,215
[45] Date of Patent: Jan. 25, 2000

[54] EXPANDABLE PANEL FOR ENVIRONMENTALLY CONTROLLABLE CHAMBER

[75] Inventors: Charles Lillja; David Roy Hugh, both of Houston, Tex.

[73] Assignee: Reliability Inc., Houston, Tex.

[21] Appl. No.: 08/950,285

[22] Filed: Oct. 14, 1997

Related U.S. Application Data

[60] Provisional application No. 60/028,379, Oct. 15, 1996.
[51] Int. Cl.⁷ .................................. F23J 1/06; F23M 7/00
[52] U.S. Cl. ....................................... 432/250; 110/173 R
[58] Field of Search ..................... 432/250–251; 219/385, 392; 110/172, 173 R

[56] References Cited

U.S. PATENT DOCUMENTS

| | | | |
|---|---|---|---|
| 4,883,002 | 11/1989 | Schuster | 110/173 R |
| 5,193,998 | 3/1993 | Hack et al. | 432/250 |

*Primary Examiner*—Teresa Walberg
*Assistant Examiner*—Gregory A. Wilson
*Attorney, Agent, or Firm*—E. Randall Smith

[57] ABSTRACT

An apparatus having at least one environmentally controllable chamber with an opening includes a chamber opening covering having at least one expandable portion that is expandable into the chamber when the covering is in a closed position. A chamber opening covering actuator enables movement of the covering between at least one open position and a closed position relative to the opening. The open position of the chamber opening covering allows at least partial access to the chamber through the opening.

28 Claims, 16 Drawing Sheets

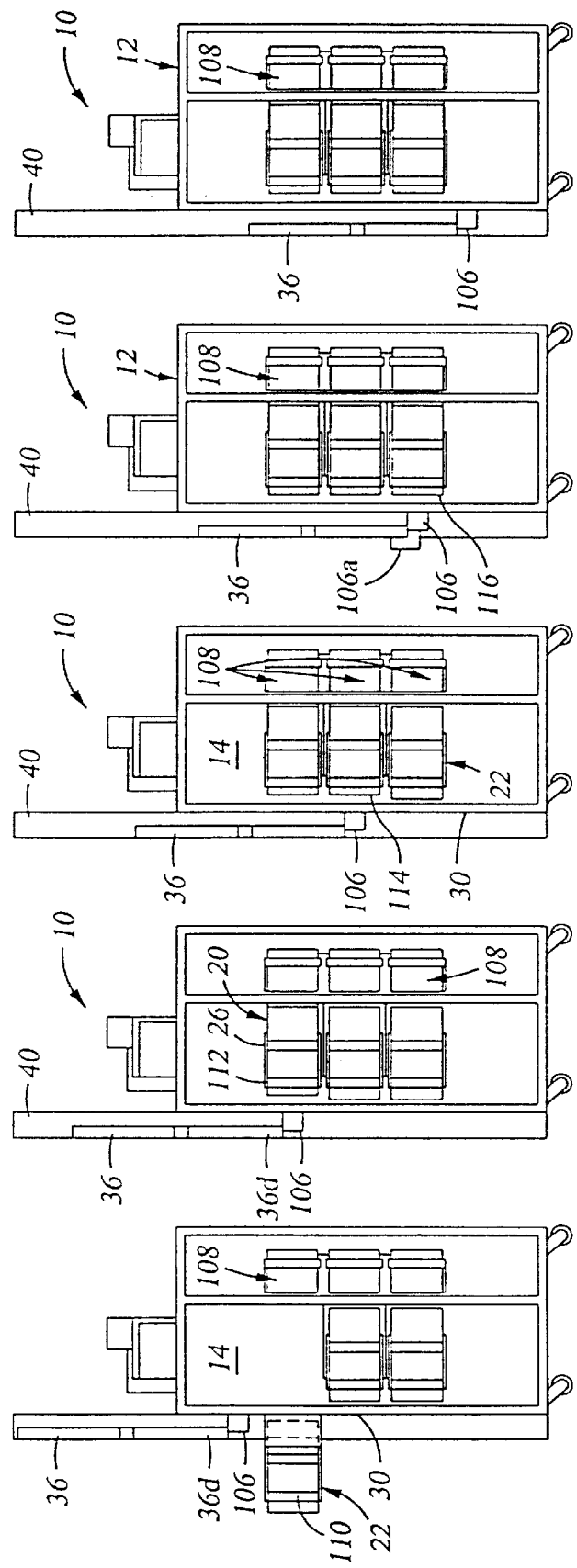

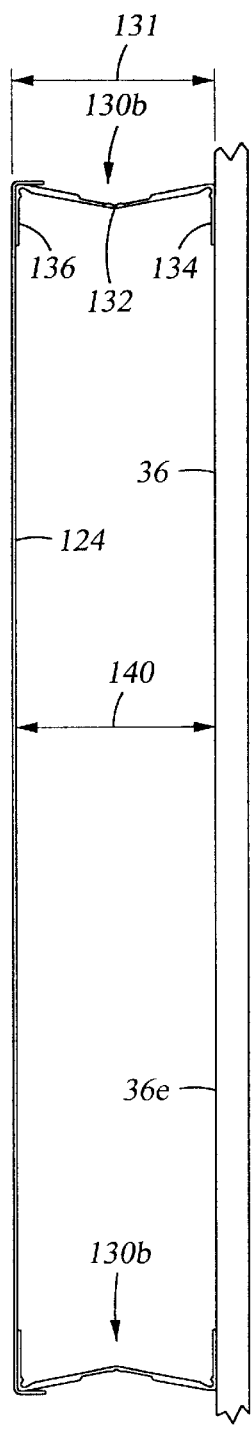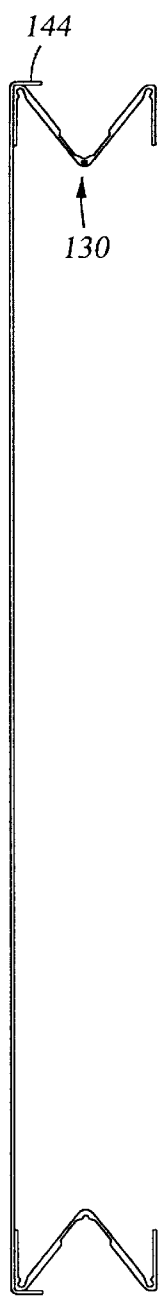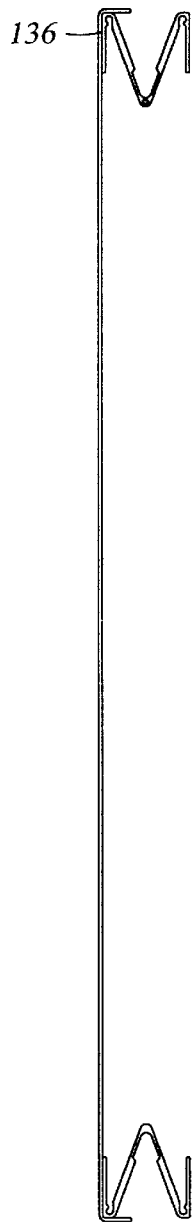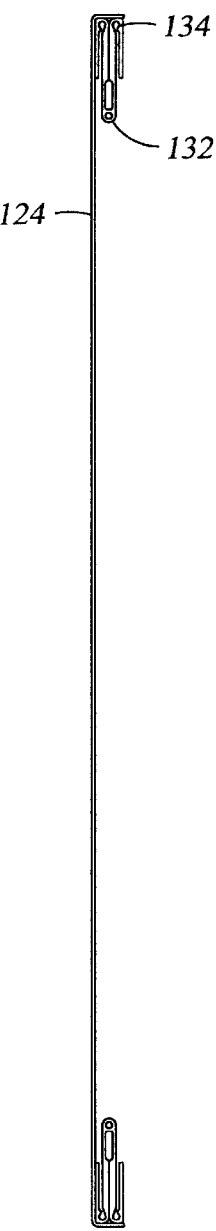
*Fig. 10a*  *Fig. 10b*  *Fig. 10c*  *Fig. 10d*

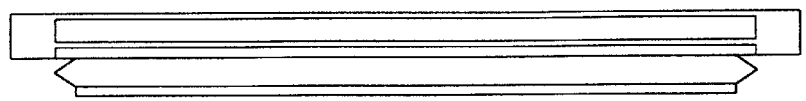
Fig. 11e
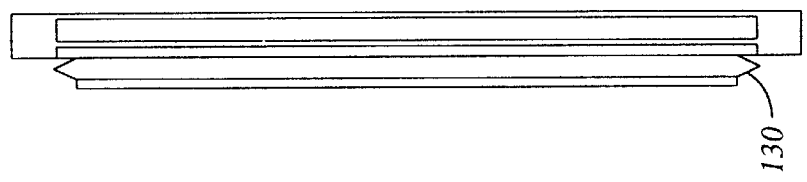
Fig. 11d
Fig. 11c
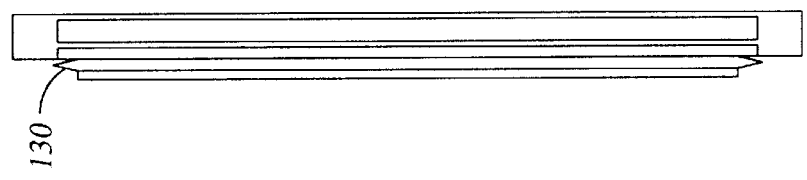
Fig. 11b
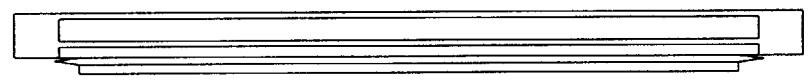
Fig. 11a
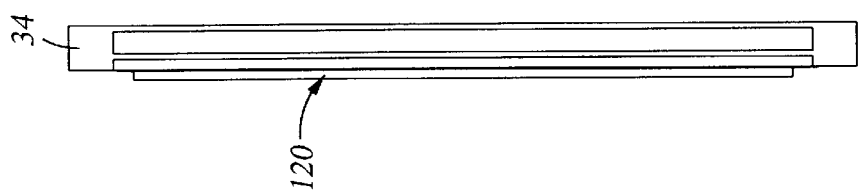

EXPANDABLE PANEL FOR ENVIRONMENTALLY CONTROLLABLE CHAMBER

CROSS REFERENCE TO RELATED APPLICATIONS

The present application claims the benefit of U.S. Provisional Application Ser. No. 60/028,379, filed Oct. 15, 1996, entitled Expandable Air Deflection Panel, which is incorporated herein by reference.

STATEMENT REGARDING FEDERALLY SPONSORED RESEARCH AND DEVELOPMENT

Not applicable.

BACKGROUND OF THE INVENTION

The invention relates generally to the field of apparatus having environmentally controllable chambers, such as devices for stressing or testing electronic circuit components. More particularly, the present invention relates to a removable panel for use with such apparatus, and still more particularly, to a door having an expandable portion for use with apparatus for burning-in and testing circuit components.

Integrated (IC) circuit packages and other semiconductor products are mass-produced and installed in electronic circuits within highly sophisticated, complex and costly equipment. As with many mass-produced products, IC packages are prone to failure, in some cases within the first one thousand hours of operation. The complexity of equipment within which such packages are installed makes post-installation failures highly undesirable. For example, when equipment reaches the final inspection stage of production, before failures are detected, the high level skills required for inspection and repair add a significant cost to production expenses. Even more significantly, when the product has been installed in the field and a service technician must make warranty repairs, the costs thereby incurred can have a significant effect on profitability. More and more often, however, post-installation failures simply cannot be tolerated because of the potentially disastrous consequences. As a result, manufacturers of electronic equipment are demanding ever greater quality and dependability in commercial grade IC packages.

Quality and dependability are enhanced substantially by early detection of those IC packages likely to fail early, prior to the installation of the IC packages in equipment. One method for detecting flawed IC packages is referred to as "burn in." "Burn-in" generally involves a technique for stressing and possibly also testing IC packages within their physical and electrical limits to discover IC packages that may be prone to early failure, or to enable the grading and sorting of IC packages according to performance specifications. One burn-in technique includes loading a large number of IC packages into sockets on numerous printed circuit, or burn-in boards; placing the burn-in boards into a housing with a chamber having an environment, particularly temperature, that is closely controllable; applying electrical test signals to each IC package on each burn-in board while uniformly subjecting the IC packages to the same temperature for a specific period of time; removing the boards from the chamber; and unloading the IC packages from the burn-in boards for sorting, distribution, and use or disposal.

An example of a "burn-in" chamber of the prior art holds up to seventy-two burn-in boards, each board holding numerous hundred IC packages. It is well known that there is a need to have an access opening to the burn-in chamber to allow loading and unloading of burn-in boards. Further, the chamber must have a door, or access opening covering, to cover and uncover the access opening. Prior art burn-in chambers are shown, for example, in U.S. Pat. No. 5,359,285 to Hashinaga et al., and U.S. Pat. No. 5,003,156 to Kilpatrick et al. Problems have been encountered with typical prior art burn-in chambers, which have doors that swing open outwardly from the front of the chambers. Significant space requirements are necessary to allow opening of the front swinging doors and loading and unloading of burn-in boards, which are typically transported on rolling carts. Ergonomic problems have been encountered by personnel loading and unloading the burn-in boards around the chamber doors, which typically requires the physically awkward and physically stressful movement of turning around to transfer boards between a burn-in board cart, or holder, and the chamber.

In another aspect of burn-in chambers, it is important to control the temperature within the chambers because slight variations in temperature can have a significantly detrimental effect on burn-in. In typical burn-in chambers, the temperature of the IC packages is controlled by directing a continuous flow of temperature controlled air over the boards during burning-in. The air absorbs the extreme amounts of heat generated by the IC packages mounted on the burn-in boards and is thereafter removed from the chamber. For burning-in powerful, high dissipation IC packages, for example, the air flow over the burn-in boards must be of a high volume, such as at a rate of over 2,600 cubic feet per minute, to effectively remove the heat generated by the IC packages.

For effective burn-in of IC packages, the temperature controlled air should generally uniformly flow over the burn-in boards and IC packages. However, spaces or gaps are formed between the burn-in boards and the access door and interior walls of the typical burn-in chamber, creating an air flow path of least resistance not over the boards. Air also deflects off of the burn-in boards and into the gaps. The gaps thus cause a reduction in the necessary airflow over the IC packages on the boards. The undesired air flow in gaps between the burn-in boards and the interior walls of the chamber is minimized in prior art chambers by filling or blocking the gaps with various devices, such as air deflectors, baffles or insulation. The access doors of typical prior art devices, however, are not equipped for effectively filling or blocking the gap formed between the door, or covering, and the burn-in boards inside the chamber, while also avoiding the ergonomic problems described above.

Problems similar to those described above also exist with doors for other types of devices used for stressing and testing electronic circuit components and other types of devices having environmentally controllable chambers used for other purposes and in other fields, such as convection-type ovens.

Thus, there remains a need for an environmentally controllable chamber covering, or access door, that does not swing open outwardly from the front of the chamber and has an expandable portion capable of extending into the chamber and sufficiently filling or blocking the space in the chamber adjacent the chamber covering. Preferably, the chamber covering will be easy to move between open and closed positions and the expandable portion will be easily and controllably expanded and retracted. Especially well received would be a chamber covering that requires minimal space around the chamber for opening and closing the covering, such as a covering that moves upwardly and downwardly, and does not require burn-in board loading/unloading personnel to have to turn around to load and unload the chamber. Ideally, the covering could be used with a device having multiple chambers or chamber openings, could be moved into various intermediate open positions and used in conjunction with apparatus for automated loading and unloading of the materials (such as IC packages) placed in the chamber. Further, it would be beneficial for the device to be used to retrofit existing environmentally controllable chambers.

BRIEF SUMMARY OF THE INVENTION

In accordance with the present invention, there is provided an apparatus having at least one environmentally controllable chamber, the chamber having an opening and the device including a chamber opening covering. The covering includes at least one expandable portion that is expandable into the chamber when the covering is in a closed position. A chamber opening covering actuator enables movement of the covering between at least one open position and a closed position relative to the opening. The open position of the chamber opening covering allows at least partial access to the chamber through the opening. The expandable portion may be capable of substantially occupying the space inside the chamber adjacent the covering when the covering is in the closed position and the expandable portion is expanded.

Depending on the application of the apparatus, the chamber opening covering may include first and second adjacent expandable portions and may be moveable upwardly into an open position and downwardly into a closed position. Further, the chamber opening covering may be capable of being moved into at least two open positions, such as having four open positions, and may be used with a burn-in board seating device when the chamber is a burn-in chamber.

In one embodiment, the chamber opening covering actuator includes a motor, at least one chain guide rotatable by the motor, and at least one chain engageable with the chain guide and the chamber opening covering. The covering actuator may further include a shaft rotatable by the motor and a counterbalance spring associated with the shaft. In one embodiment, the expandable portion includes a face member and at least two side hinge members. Each side hinge member may include three hinges. The expandable portion may be inflatable.

The present invention may include an expandable portion expansion mechanism. The expansion mechanism may have at least one resilient urging member and/or at least one piston. The present invention may also include an expandable portion retraction mechanism. In one embodiment, the expandable portion retraction mechanism includes at least one cord-like member connected with the expandable portion and being moveable by a retraction mechanism actuator. Further, the present invention may include at least one guide member capable of assisting in maintaining alignment of the chamber opening covering with the chamber.

In another embodiment, the present invention involves a device for substantially occupying the space between at least one burn-in board disposed in a burn-in chamber and an access opening to the chamber. This embodiment includes a door movable between at least one open position and a closed position relative to the opening, and at least one expandable portion disposed on the door, the expandable portion being expandable into the chamber and capable of substantially occupying the space inside the chamber adjacent the door when the door is in the closed position. The door may be moveable upwardly into an open position and downwardly into a closed position. Further, a door actuator may be included having a motor, at least one chain guide rotatable by the motor, and at least one chain engageable with the chain guide and the door. The door actuator may also have a shaft rotatable by the motor and a counterbalance spring associated with the shaft. A burn-in board seating device may be used with the present invention and may be connected with the door.

The expandable portion may include a face member and at least two side hinge members. The device may also include an expandable portion expansion mechanism having at least one resilient urging member. The expandable portion expansion mechanism may also, or instead, have at least one piston. The present invention may also include an expandable portion retraction mechanism, one embodiment including at least one cord-like member connected with the expandable portion, the cord-like member being moveable by a retraction mechanism actuator.

In yet another embodiment, the present invention includes an apparatus having at least one environmentally controllable chamber, the chamber having an opening, the apparatus including means for covering the chamber opening and means for moving the covering means. The covering means is movable between at least one open position and a closed position relative to the opening. The apparatus also includes expandable means connected with the covering means, wherein the expandable means is expandable into the chamber when the covering means is in the closed position.

Accordingly, the present invention comprises a combination of features and advantages which enable it to substantially advance the technology associated with environmentally controllable chambers, such as burn-in chambers. The chamber opening covering, or access door, of the present invention has an expandable portion capable of extending into the chamber and sufficiently filling or blocking the space in the chamber adjacent the chamber opening covering, enabling optimal environmental control within the chamber. Preferably, the chamber covering of the present invention is easy to move between open and closed positions, and the expandable portion is easily and controllably expanded and retracted. The covering of the present invention can be configured so that it does not swing open outwardly from the chamber and requires minimal space around the chamber for opening and closing the covering, such as a covering that moves upwardly and downwardly. The covering of the present invention could be configured to be used with a device having multiple chambers, or multiple chamber openings, could be moved into various intermediate open positions and used in conjunction with apparatus for automated loading and unloading of the materials, such as IC packages, placed in the chamber. Further, the present invention can be used to retrofit existing environmentally controllable chambers. The characteristics and advantages of the present invention described above, as well as additional features and benefits, will be readily apparent to those skilled in the art upon reading the following detailed description and referring to the accompanying drawings.

BRIEF DESCRIPTION OF THE DRAWINGS

For a detailed description of the preferred embodiments of the invention, reference will now be made to the accompanying drawings wherein:

FIGS. 7a–e are right side views of the device of FIG. 1, each showing the interior of the chamber and a different position of the chamber opening covering.

FIGS. 10a–d are side views of a preferred embodiment of the expandable portion of the covering of the present invention showing the upper and lower hinge members of the expandable portion.

FIGS. 11a–j are side views of a covering of the present invention having a preferred embodiment of an expandable portion showing the upper and lower hinge members of the expandable portion.

DETAILED DESCRIPTION OF THE PREFERRED EMBODIMENTS

Figure 1:
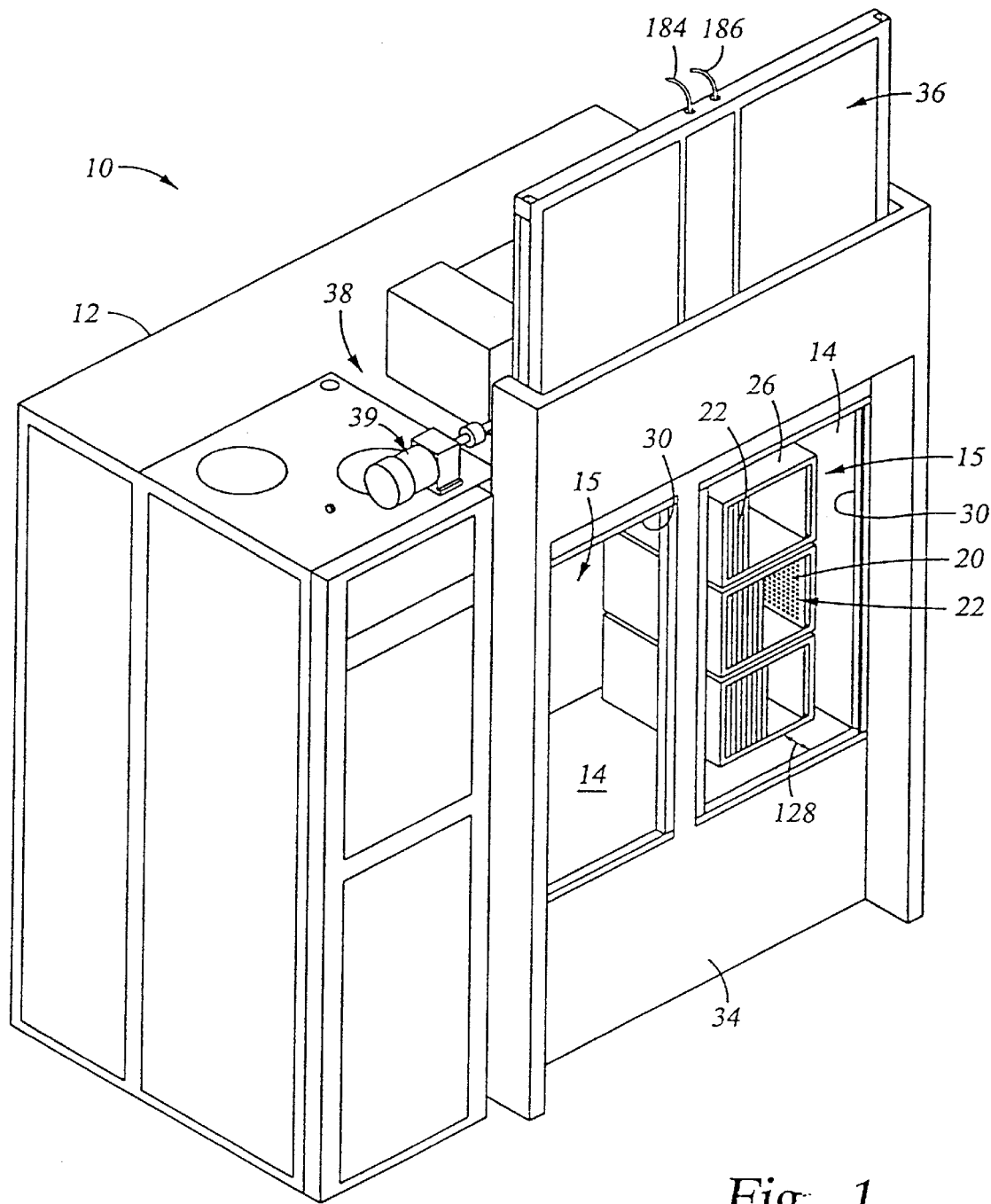
FIG. 1 is an isometric view of a device for burning-in circuit components having a burn-in chamber and a preferred embodiment of a chamber opening covering with a pair of expandable portions made in accordance with the present invention.

The presently preferred embodiments of the invention are shown in the above-identified figures and described in detail below. In describing the preferred embodiments, like or identical reference numerals are used to identify common or similar elements. The figures are not necessarily to scale and certain features and certain views of the figures may be shown exaggerated in scale or in schematic form in the interest of clarity and conciseness.

Referring initially to FIG. 1, there is shown a device 10 having a housing 12 with an insulated, substantially airtight, environmentally controllable chamber 14. The chamber 14 is useful for testing, or burning-in, IC packages 20 disposed on burn-in boards 22, as is known in the art. For example, the device may hold seventy-two boards 22, each board capable of holding up to numerous hundreds of IC packages 20. The burn-in boards 22 are either situated directly on racks 26 disposed within the chamber 14, or placed in groups of boards 22 onto cartridges 110 (FIG. 7a) likewise mountable on the racks 26. Electrical ports, or sockets, 108 (FIGS. 7a–e) located in the rear of the chamber 14 are aligned with the racks 26 for connection with the burn-in boards 22 for providing and monitoring electrical test signals to the IC packages 20 on the boards 22, as is known in the art. The construction, configuration and operation of the boards 22, racks 26, cartridges 110, ports 108, and other components of the device 10 necessary for enabling burning-in and testing of the IC packages, such as a power supply, electronic circuitry, computer software and hardware, control mechanisms, air heaters and air blowers, are well known in the art. It should be understood that the present invention, as will be described below, is likewise useful with other types of environmentally controllable chambers.

Still referring to FIG. 1, access to the interior 15 of the chamber 14 for loading and unloading of the boards 22 onto the racks 26, inserting and extracting of the boards 22 and for maintenance and repair of the device 10 is provided through openings 30 in the front wall 34 of the housing 12. It should be understood that although a preferred embodiment of the present invention is described herein with respect to a single chamber burn-in device 10, the present invention may be used with multiple chamber burn-in devices, as well as other types of devices for stressing/testing electronic circuit components and devices otherwise having environmentally controllable cavities. As used herein, the term "chamber" means a compartment or cavity, while the term "chamber opening" means an aperture, hole or orifice that allows access to the interior of the chamber. Within the chamber is a "treatment space," which is the area where the environmentally controlled activity, or treatment, occurs. For example, with respect to the embodiment shown in FIG. 1, the treatment space is the interior 15 of the chamber 14. This is where the exemplary treatment—burning-in of IC packages 20—occurs. The interior 15 of the chamber 14 extends at the front of the chamber 14 to the opening 30 of the chamber 14.

The present invention generally includes a covering, or access door, 36 that covers the chamber openings 30 and is moveable between open and closed positions over the openings 30, a covering actuator 38, and an expandable portion 120 (FIGS. 9a, 9b) on the inner surface 36e of the covering 36 moveable between expanded and retracted positions.

Figure 8A:
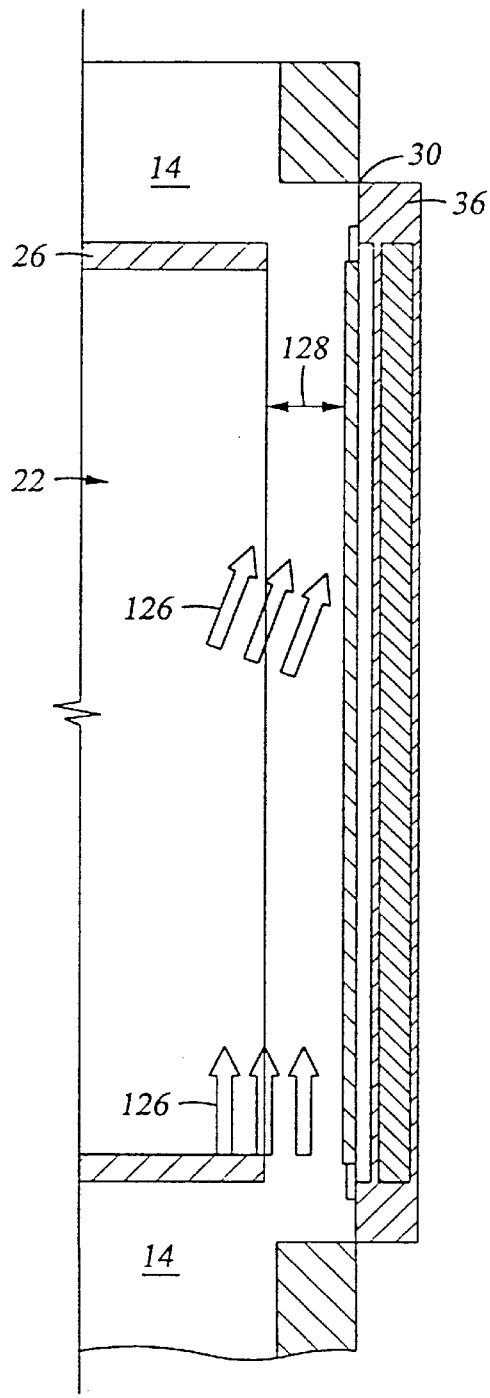
FIG. 8a is a partial cross-sectional view of the device of FIG. 2 taken along lines 8—8 showing the chamber opening covering in a closed position.
Figure 8B:
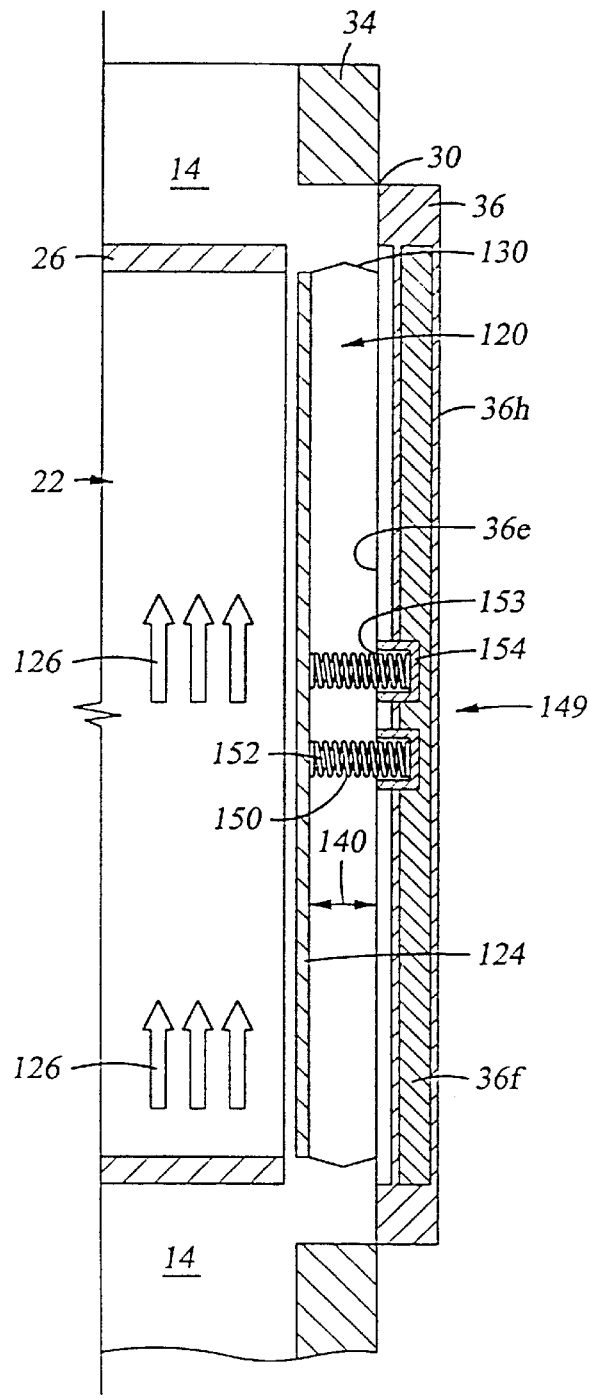
FIG. 8b is a view of FIG. 8a showing the expandable portion of the chamber opening covering in an expanded position.

Referring to FIG. 8b, the covering 36 of the preferred embodiment has an inner surface 36e, an outer surface 36b and an interior cavity 36f. Any suitable material having sufficient structural support capabilities may be used to form the covering 36, such as cold rolled steel or aluminum. While a preferred embodiment of the chamber opening covering 36 is described in detail below, it should be understood that the term "covering" as used herein means a device formed with any shape, configuration, component parts and operation that is compatible for use with an environmentally controllable chamber, includes an expandable portion as will be described below, and is movable between open and closed positions relative to a chamber opening.

Figure 2:
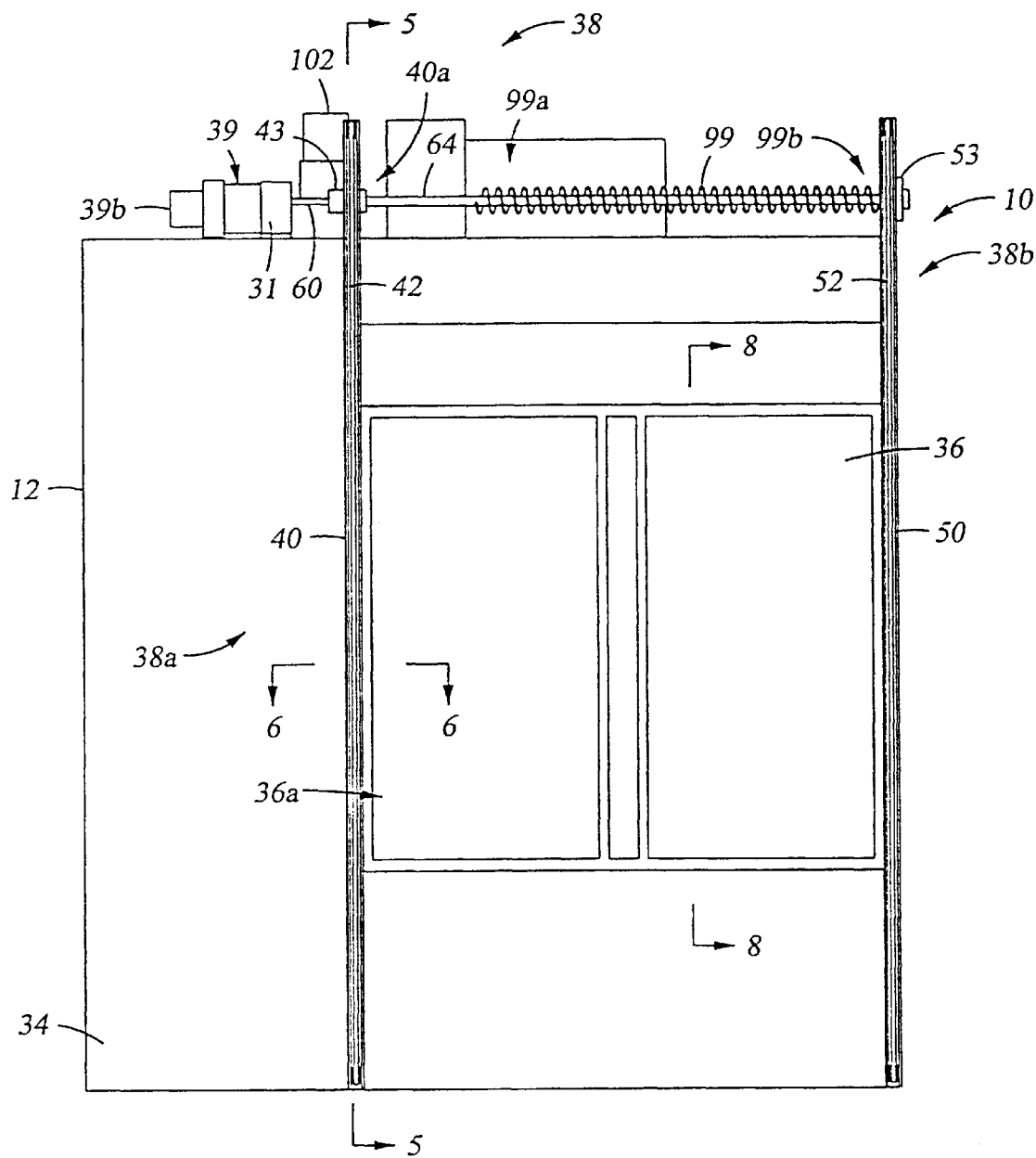
FIG. 2 is a front view of the device of FIG. 1 showing a preferred embodiment of the covering actuator of the present invention.

As shown in FIGS. 1 and 2, the covering 36 is preferably movable vertically between open and closed positions relative to the openings 30 with the use of the covering actuator 38. As used herein, the term "covering actuator" means any device capable of enabling the movement of the covering of the present invention between open and closed positions relative to a chamber opening and that is otherwise compatible for use with the present invention. Referring specifically to FIG. 2, the preferred covering actuator 38 includes a motor 39, left and right rails 40, 50, left and right chains 42, 52, and various chain guides, such as sprockets 43, 44, 45, 46 and 48 (FIG. 4), as will be described further below. The chains 42, 52 may be any among a variety of suitable commercially available chains, such as ⅜ pitch roller chain. The various chain guides may be selected from among a variety of commercially available sprockets suitable for carrying the chains 42, 52 and otherwise compatible for use with the present invention. The rails 40, 50 of the preferred embodiment may be any among a variety of commercially available rails, or extrusions, that are suitable for use with the present invention, such as the aluminum conveyor extension Model No. 14-150 sold by ITEM.

Figure 3:
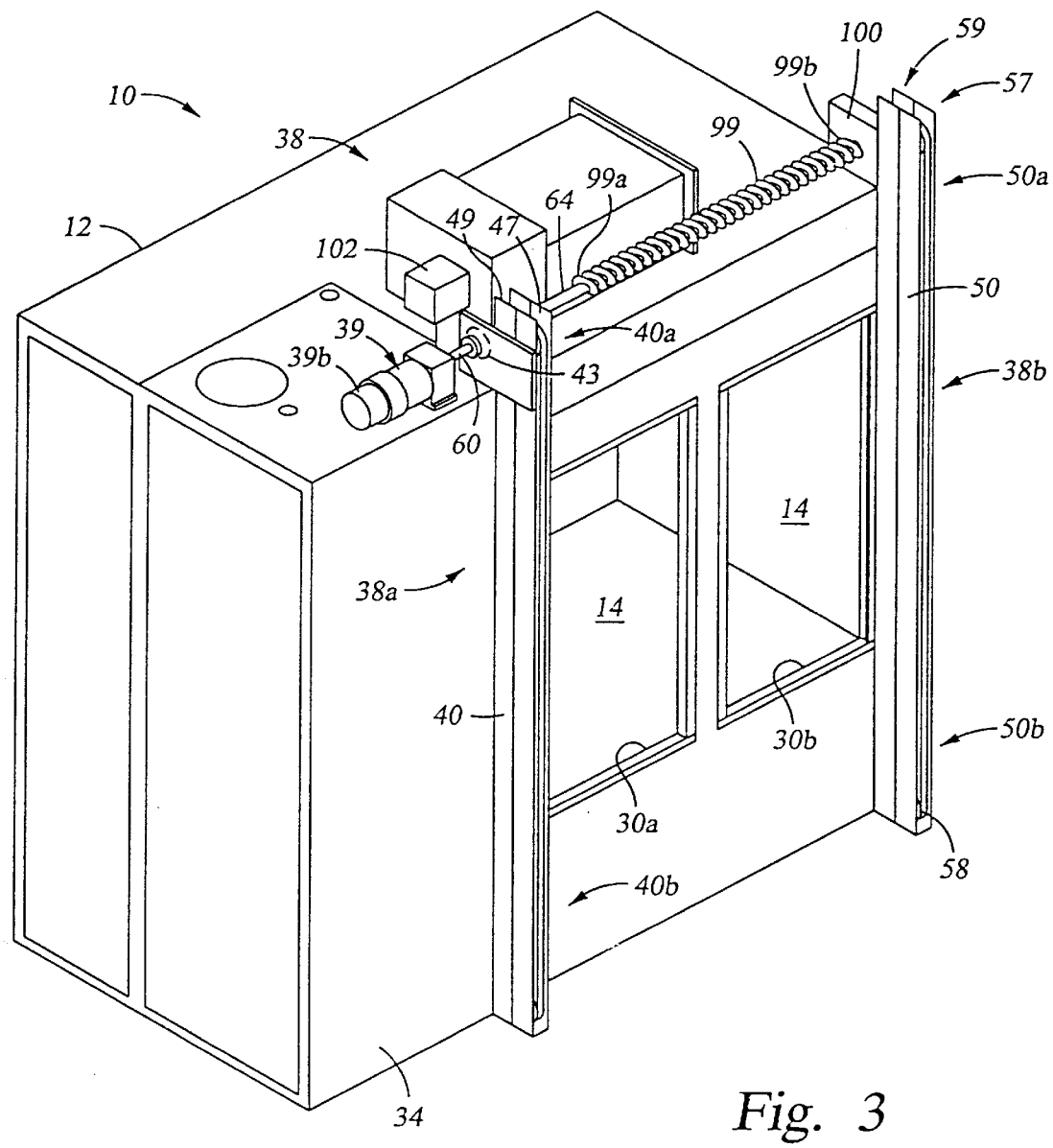
FIG. 3 is an isometric view of the device of FIG. 2 having the covering of the present invention removed.

As shown in FIGS. 2 and 3, the left rail 40 is preferably mounted on the front wall 34 of the housing 12 adjacent to the left side of the left opening 30a to the chamber 14, while the right rail 50 is mounted adjacent to the right side of the right opening 30b to chamber 14. The motor 39 of the preferred embodiment of the covering actuator 38 includes a gearbox 39a and a brake mechanism 39b, and may be any conventional standard electric motor suitable for use with the present invention. Although the motor 39 is shown mounted on the housing 12 proximate to the upper end 40a of the left rail 40, it may be disposed at any other suitable location within or upon the device 10. The motor 39 rotatably drives a shaft 60 extending laterally from the motor 39 to a left drive sprocket 43 mounted to the device 10 behind the left rail 40. A second shaft 64 extends laterally from the left drive sprocket 43 to a corresponding right drive sprocket 53 similarly disposed with respect to the right rail 50. Selective actuation of the motor 39 causes the shafts 60, 64 and the sprockets 43, 53 to rotate in one direction to close the covering 36 and in the opposite direction to open the covering 36, as will be described further below.

Figure 4:
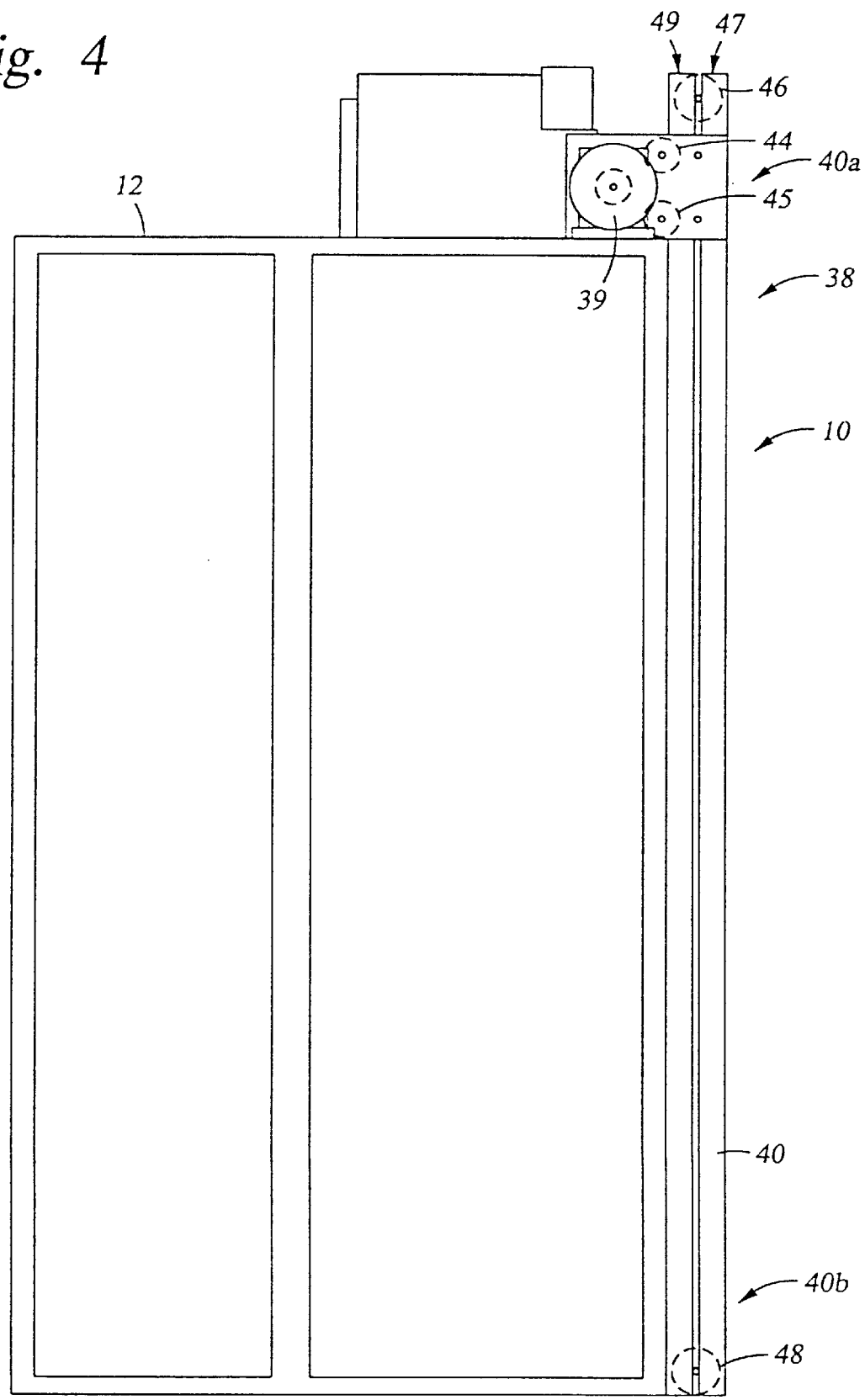
FIG. 4 is a left side view of the device of FIG. 3.
Figure 5:
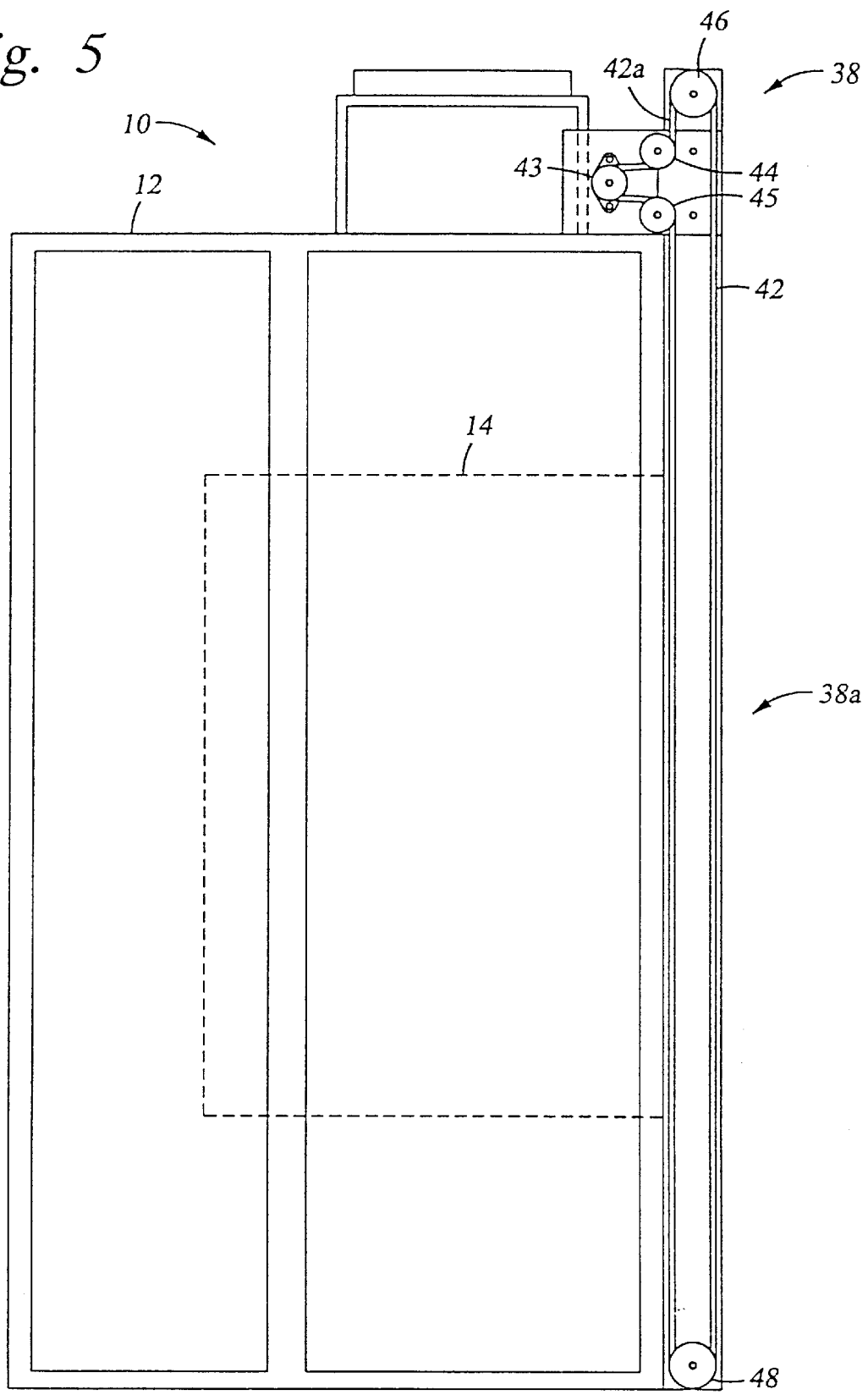
FIG. 5 is a cross-sectional view of the device of FIG. 2 taken along lines 5—5 showing the left chain without the left rail of a covering actuator made in accordance with the present invention.

The left side 38a of the preferred embodiment of the covering actuator 38 is shown in FIGS. 4 and 5. The left chain 42 passes around the left drive sprocket 43 (FIG. 5) and is directed upwardly therefrom at one end as it extends around a first left middle sprocket 44, and downwardly therefrom at the other end as it extends around a second left middle sprocket 45. The upper end 42a of the chain 42 then loops over an upper left sprocket 46, which is mounted within the upper end 40a of the rail 40. From the upper left sprocket 46, the chain 42 extends downwardly through the length of a front passageway 47 of the rail 40. At the lower end 40b of the rail 40, the chain 42 loops around a lower left sprocket 48 mounted therein, and is then directed up a rear passageway 49 of the rail 40 to the sprocket 45. The configuration, operation and components of the right side 38b (FIGS. 2, 3) of the covering actuator 38, which includes the right rail 50 and chain 52, and corresponding right drive sprocket, first and second right middle, upper right and lower right sprockets (not shown), are similar to that of the left side 38a of the covering actuator 38.

Figure 6:
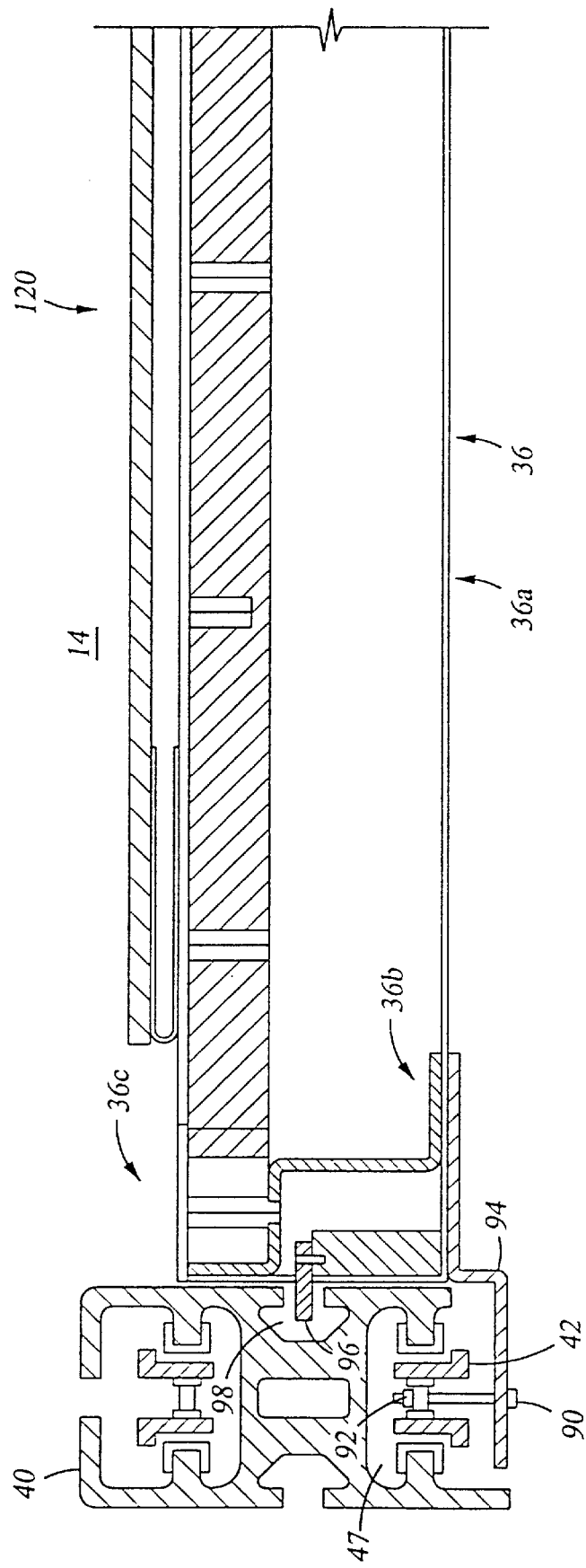
FIG. 6 is a partial cross-sectional view of the device of FIG. 2 taken along lines 6—6.

In the preferred embodiment of the present invention, as shown, for example, in FIG. 6, the covering 36 is connected to the left chain 42 to enable movement of the covering 36 between open and closed position. The covering 36 is shown connected to the left chain 42 along a lower portion 36a of the covering 36 with any among a variety of commercially available connectors suitable for use with the invention, such as bolts 90 and nuts 92. The bolts 90 connect a lip, or faceplate, 94 extending from the left front edge 36b of the covering 36 across the front of the left rail 40 to a portion of chain 42 disposed in the front passageway 47 of the rail 40.

The covering 36 of the preferred embodiment is similarly connected (not shown) with the right chain 52 (FIG. 2). Thus, as the chains 42, 52 are driven up and down through the left rail passageway 47 (FIG. 6) and the right rail passageway 57 (FIG. 3), respectively, by selective actuation of the motor 39, the covering 36 moves upwardly and downwardly therewith.

Referring again to FIG. 2, selective actuation of the motor 39 of the preferred embodiment to enable movement of the covering 36 between open and closed positions is accomplished with a switch mechanism 102. The switch mechanism 102 monitors the movement of the covering 36 between numerous open positions of the covering 35 relative to the openings 30 and preferably communicates with a computer (not shown) programmed to turn on and off the motor 39. Any commercially available switch mechanism compatible for use with the present invention may be used. Furthermore, the motor brake 39b, which may be any conventional brake mechanism suitable for use with the motor 39 and other components of the present invention, may be configured to engage at each open position of the covering 36, providing safety from human injury or equipment damage due to downward slippage or movement of the covering 36.

As shown in FIGS. 7a–7e, for example, the covering actuator 38 (FIG. 2) may allow for a total of five different positions of the covering 36. FIG. 7a illustrates a fully open position of door 36, whereby all boards 22 in the chamber 14 are accessible through the opening 30. FIG. 7b shows the covering 36 lowered to an intermediate open position that also allows access to all boards 22. FIG. 7b also illustrates a burn-in board seating device 106 used in conjunction with the present invention for automated seating and unseating of burn-in boards 22, such as a top row 112 of boards 22, onto racks 26 in the chamber 14. U.S. patent application Ser. No. 08/949,749, filed on Oct. 14, 1997 and having common inventors and a common assignee with the present application, which is hereby incorporated by reference in its entirety, describes a burn-in board seating device compatible for use with the present invention. FIGS. 7c and 7d show second and third intermediate open positions of covering 36 allowing particular access to middle and lower rows 114, 116 of burn-in boards 22, respectively. The burn-in board seating device 106 is similarly shown seating and unseating boards 22 in rows 114, 116. In FIG. 7d, the seating device 106 is shown connected with the covering 36 with a connector 106a, which can be constructed from suitable material, such as cold rolled steel or aluminum. Finally, FIG. 7e illustrates a closed position of the covering 36.

It should be understood that the covering actuator 38 may, however, take other forms and have different component parts as those described above to enable movement of the covering 36 between open and closed positions. Further, the covering 36 of the present invention may instead be configured to move in directions other than upwardly and downwardly between open and closed positions, such as laterally, or sideways, relative to the openings 30, as desired.

The present invention may include additional features for effective, safe and easy operation of the covering 36. These additional features, however, are not essential for operation of the present invention. For example, one or more conventional infra-red light or movement sensors (not shown) may be attached to the device 10 for triggering engagement of the brake mechanism 39b (FIG. 2) or the switch mechanism 102 upon entry of an object into opening 30 when the covering 36 is in an open position. For another example, referring again to FIGS. 2 and 3, a conventional counterbalance spring 99 may be disposed about the shaft 64 for bearing a portion of the weight of the door 36. The spring 99 is preferably connected at one end 99a to the shaft 64, and at the other end 99b to the device 10, such as to a plate, or bracket, 100 (FIG. 3). Because the covering 36 may be of substantial weight, the operation of the counterbalance spring 99 will reduce the operating load imparted by the weight of the covering 36 on the component parts of the covering actuator 38, such as the motor 39 and chains 42, 52; may enable manual movement of the covering 36, if desired; and will enhance safety during use.

Yet another example of an additional feature of the preferred embodiment, as shown in FIG. 6, is one or more guide members 96. As used herein, the term "guide member" is any device capable of assisting in maintaining desired alignment between the covering of the present invention and the environmentally controllable chamber. The guide members 96 of the preferred embodiment of the present invention are elongated, or rod-like members, which are shown in FIG. 6 extending from the left side 36c of the covering 36 into a side channel 98 in the left rail 40. The guide members 96 of the preferred embodiment may be any suitable elongated member, such as a metal rod or bolt, which may be connected to the covering 36 for use with the present invention. The guide members 96 move up and down in the channel 98 with the movement of the covering 36, assisting in maintaining proper alignment of the covering 36 with respect to the rail 40, the front wall 34 (FIG. 1) of the housing 12 and the openings 30 (FIG. 1). Guide members 96 may be similarly situated at the right side (not shown) of the covering 36 for movement within a side channel (not shown) in the right rail 50. The guide members 96 may extend through the entire length of the covering 36, assisting in distribution of forces placed on the covering 36 when the expandable portions 120 are expanded, as described below.

Referring again to FIG. 1, burn-in generally requires that all IC packages 20 in the chamber 14 be subjected to the same specific temperature for a certain length of time, as is well known in the art. Heat produced by the IC packages 20 in the chamber 14 is removed by directing a continuous flow of temperature controlled air over the burn-in boards 22, as is well known in the art. The device 10 is equipped with a conventional air control system (not shown) for this purpose. Air flow is directed over the burn-in boards 22 from one or more conventional air blowers (not shown) mounted in the device 10.

As shown in FIG. 8a, when burn-in boards 22 are seated within the racks 26 in the chamber 14, a gap, or space 128 is formed between the front of the boards 22 and the covering 36 when the covering 36 is in a closed position over the opening 30. This space 128, also described as the space in the chamber 14 adjacent the covering 36 when the covering 36 is in a closed position, forms a path of least resistance for the air flow inside the chambers 14a, 14b away from the burn-in boards 22. Further, air flow in the chamber 14 will deflect from the boards 22 into the space 128, as represented by arrows 126. The space 128 thus reduces airflow and creates non-uniform airflow over all of the boards 22 and IC packages 20, preventing optimally effective burn-in.

As shown in FIGS. 8a and 8b, the covering 36 of the present invention includes an expandable portion, or plug, 120 that at least partially, and preferably substantially, occupies or fills the space 128 when the covering 36 is closed. The term "expandable portion" as used herein means a device formed with any shape, configuration, component parts and operation that can be carried by a covering of the present invention, is expandable therefrom into an environmentally controllable chamber, is capable of at least partially occupying the space inside a chamber adjacent to the covering of the present invention when the covering is in a closed position, and is otherwise compatible for use with the present invention. For example, the expandable portion 120 of the preferred embodiment may extend about 2½ inches into the gap 128, leaving approximately ⅛ inch between the surface 120a of the expandable portion 120 and the boards 22. The air stream 126 thus moves generally around the expandable portion 120 and over the burn-in boards 22 instead of through the gap 128. It should be understood that, while the preferred embodiment of the invention includes a covering 36 having two adjacent expandable portions 120 (FIGS. 9a, 9b), the invention is not limited to such configuration and may include a covering 36 with one, two, or more than two, expandable portions 120.

In the preferred embodiment of FIGS. 9a–b and 10a–c, each expandable portion 120 includes a face member, such as panel 124 connected to the inner surface 36e of the door 36 with four side hinge members 130. Each side hinge member 130 preferably includes three hinges, 132, 134 and 136; a first outer hinge 134 connects a central hinge 132 with the door 36, while a second outer hinge 136 connects the central hinge 132 with the panel 124, enabling the expansion and retraction of the panel 124 relative to the covering 36.

Figure 9A:
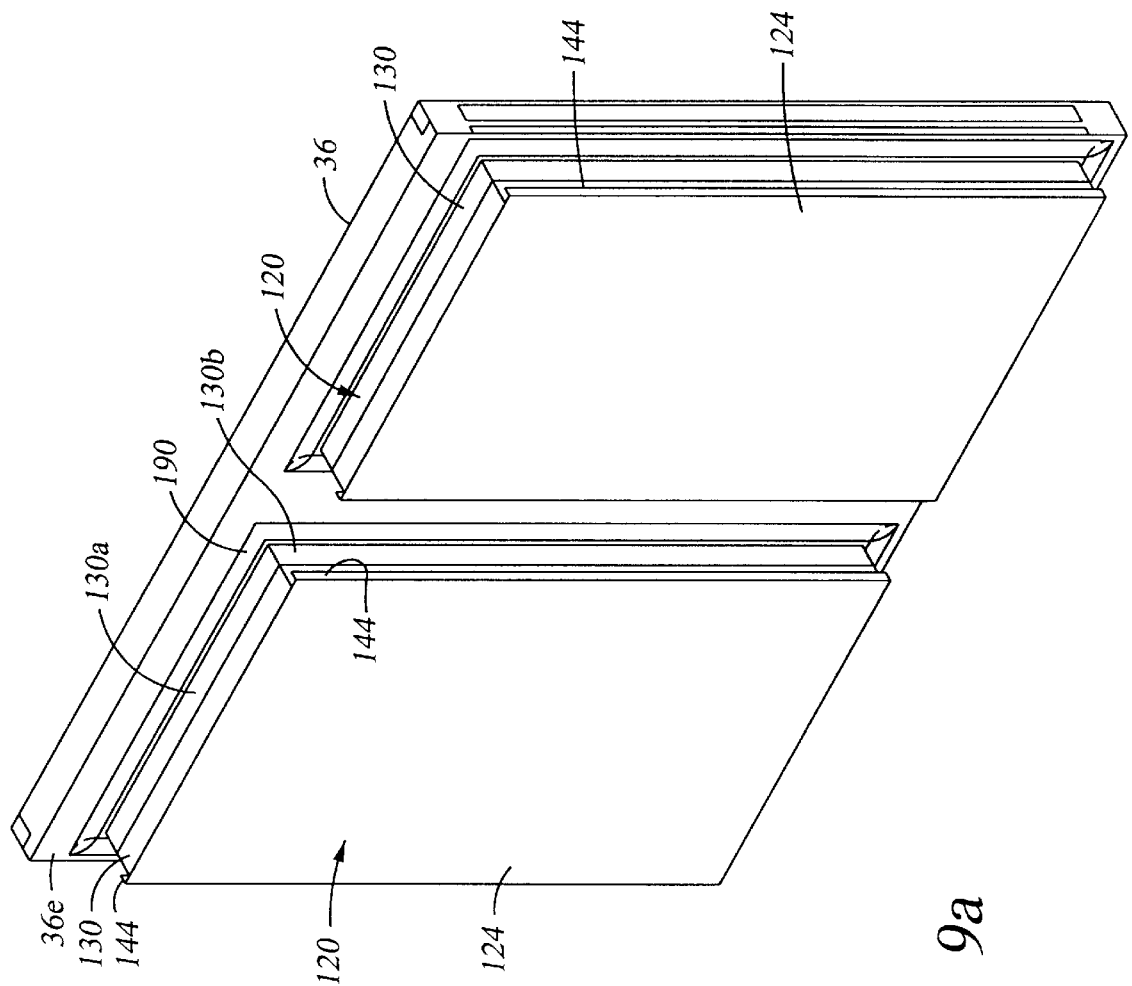
FIGS. 9a–b are isometric views of the preferred embodiment of the chamber opening covering and expandable portions of the present invention.
Figure 9B:
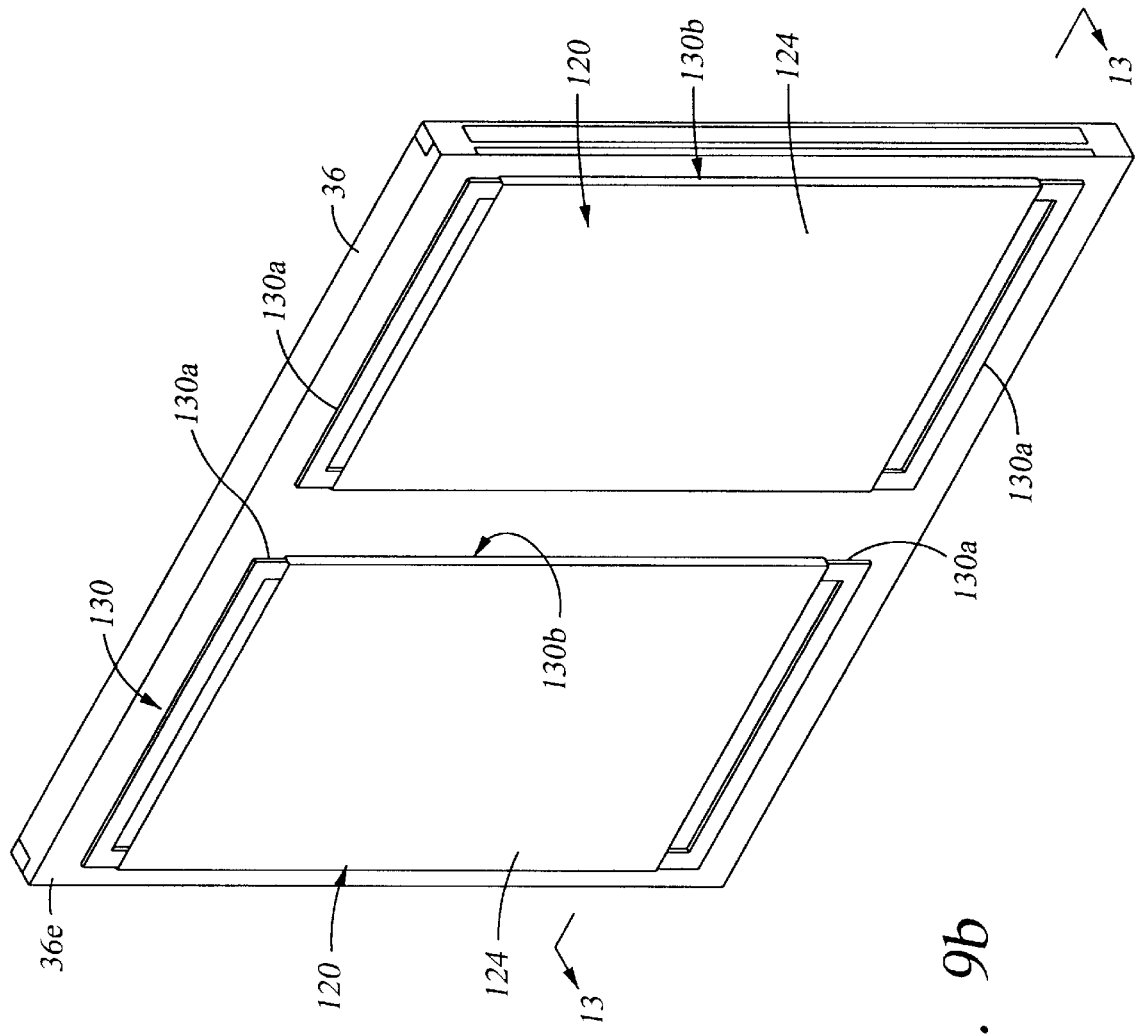
Figure 11J:
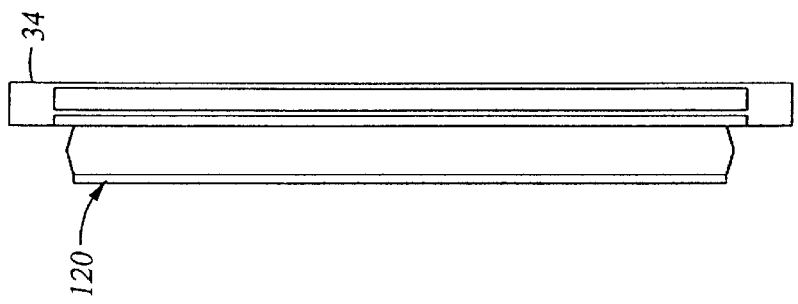
Figure 11I:
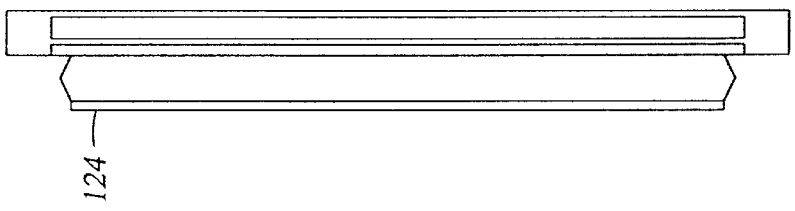
Figure 11H:
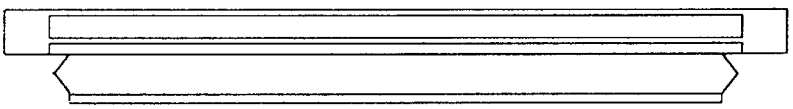
Figure 11G:
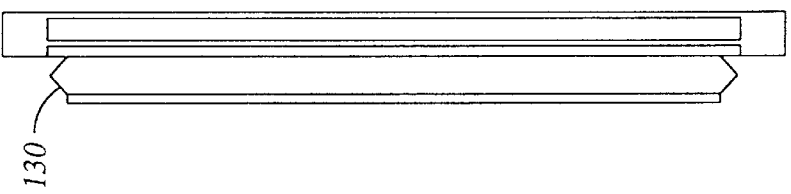
Figure 11F:
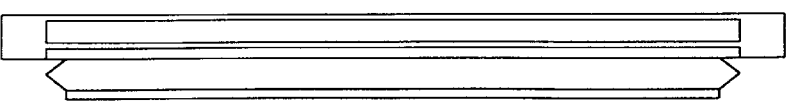

As shown in FIG. 9a, each hinge member 130 extends substantially across the entire length of the respective side, top or bottom, of the panel 124 to which it is disposed in order to substantially or fully cover a space 140 (FIGS. 8b, 10a) between the panel 124 and the covering 36, thus preventing the air inside the chamber 14 from flowing into the space 140. As shown in FIG. 9b and 11a–j, the upper and lower hinge members 130a of the preferred embodiment fold outwardly, while the side hinge members 130b fold inwardly. The panels 124 may further include a lip 144 extending partially around each side hinge member 130b, providing added stiffness to the panels 124.

The expandable portion 120 may be configured such that the width 131 (FIG. 10a) of each hinge member 130 generally represents the distance that each expandable portion 120 will expand into chamber 14. Thus, the hinge members 130 may be selected and configured based on their size so as to fit the gap 128, as desired. The hinge members 130 and component hinges 132, 134, and 136 may be any among a variety of suitable commercially available hinges, such as standard piano hinges. The panels 124 may be constructed of any suitable commercially available material, such as stainless steel. It should be understood that the expandable portion 120 can take a form or configuration and have components other than as described above, such as an inflatable or piston driven member, so long as it is expandable into the gap 128 (FIG. 8a, 8b) and does not impede opening and closing of the covering 36.

Figure 12:
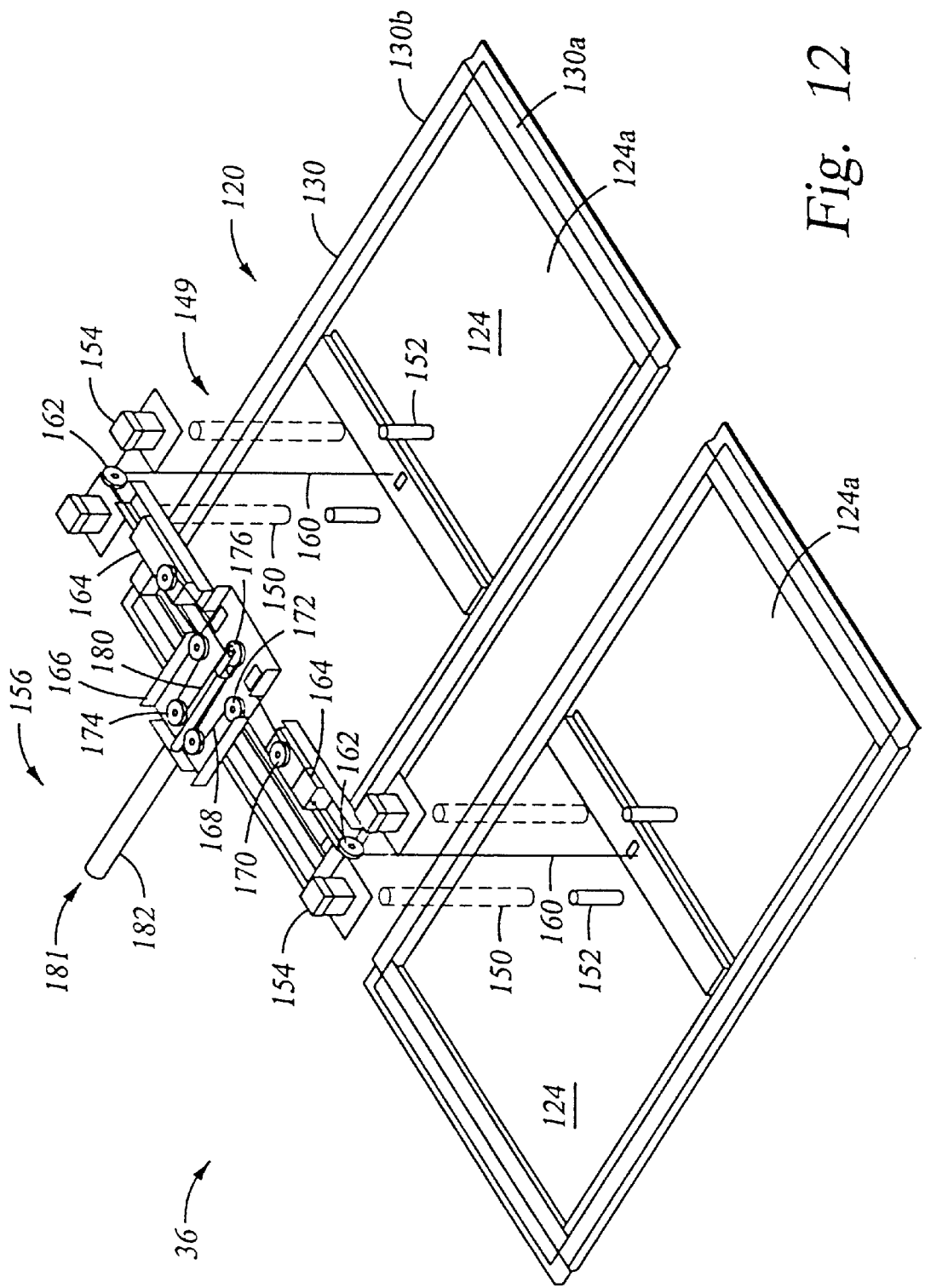
FIG. 12 is an exploded assembly diagram of a preferred embodiment of the expandable portion retraction mechanism made in accordance with the present invention and partially showing the covering in phantom.

As shown in FIGS. 8b and 12, the present invention includes an expandable portion expansion mechanism 149. The term "expandable portion expansion mechanism" means any device capable of allowing the expandable portion of the present invention to expand into a chamber when the covering of the present invention is in a closed position relative to the chamber opening, and is otherwise compatible for use with the present invention. The expandable portion expansion mechanism 149 of the preferred embodiment of the present invention includes one or more resilient urging members, such as coil springs 150, disposed between the panel 124 of the expandable portion 120 and the inner surface 36e of the covering 36 to bias the panel 134 from the covering 36. The expansion mechanism 149 allows or causes the expandable portion 120 to expand when the covering 36 is in a closed position. As shown in FIG. 12, the preferred embodiment includes two springs 150 each be disposed about a spring retention rod 152 fixed to the surface 124a of panel 124 at one end, extended through a hole 153 in the inner surface 36e of the covering 36, and disposed in a spring retention block 154 mounted within the interior 36f of the door 36 at the other end. Thus, each expandable portion 120 is expanded by the force of springs 150 relative to any resistance provided by the hinge members 130 or otherwise.

Figure 13:
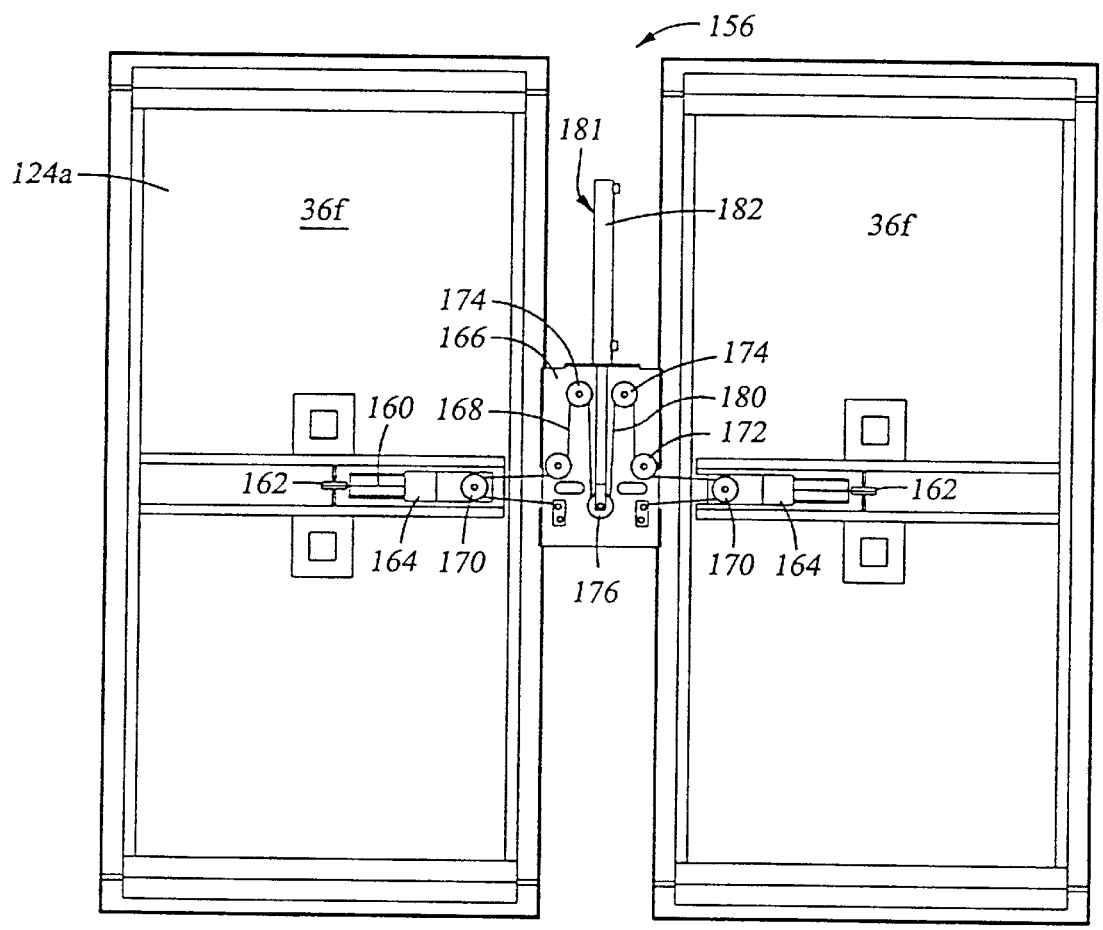
FIG. 13 is a partial cross-sectional view of a preferred embodiment of the expandable portion retraction mechanism of the present invention of FIG. 9b taken along lines 13—13.
Figure 14:
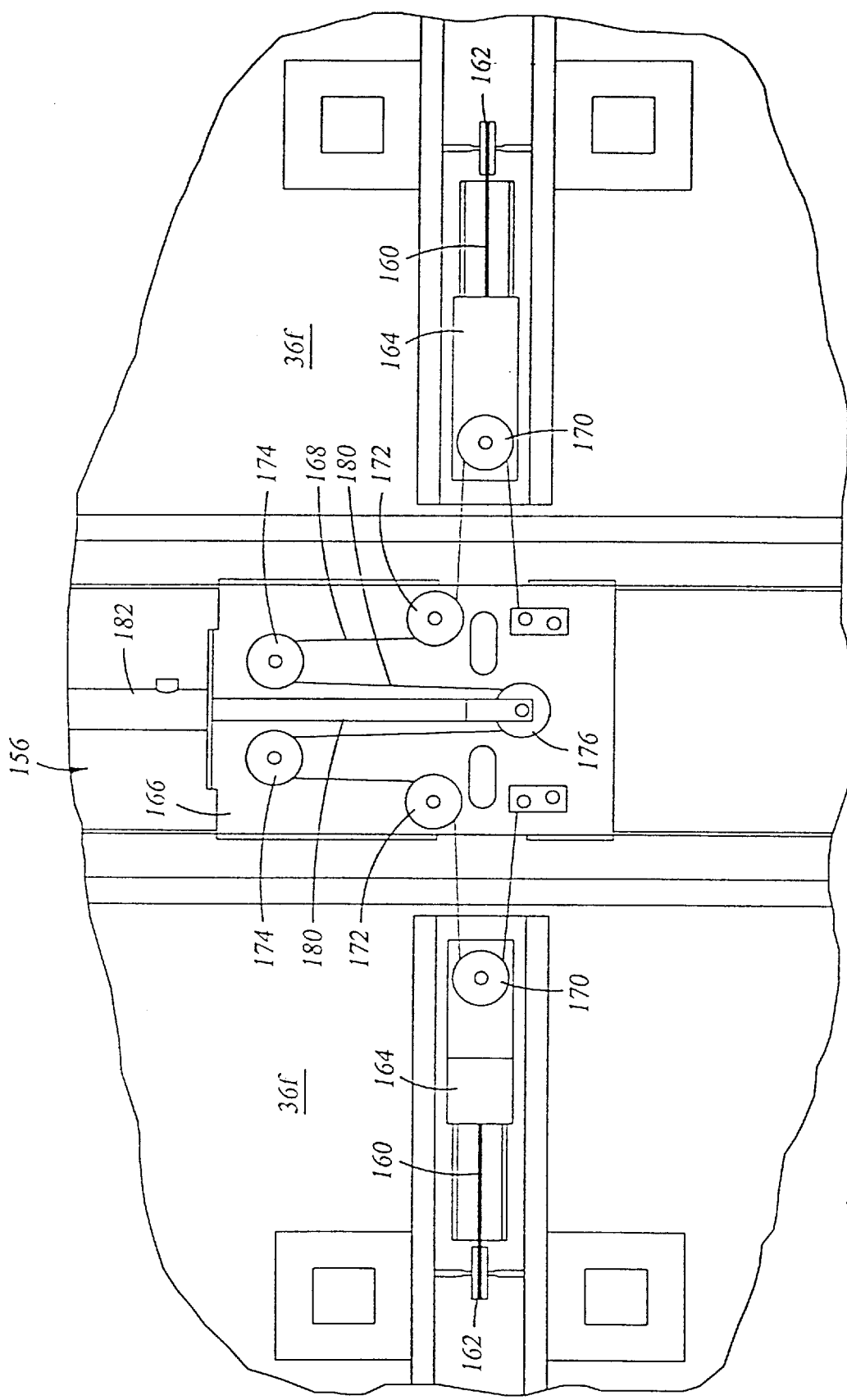
FIG. 14 is partial view of the retraction mechanism of FIG. 13.

The preferred embodiment of the invention also includes an expandable portion retraction mechanism 156, as shown in FIGS. 12–14. The term "expandable portion retraction mechanism" as used herein means a device capable of causing the expandable portion of the present invention to move from an expanded position to a non-expanded position, such as a position that allows the covering of the present invention to be moved from a closed to an open position relative to the chamber opening. The preferred retraction mechanism 156 includes a separate cord-like member 160, such as a wire or cable, attached to a surface 124a of each expandable portion panel 124 and extending into the interior cavity 36f of the covering 36 through a hole 161. Therein, each cable 160 passes over a pulley 162 and terminates at a traveling block 164, respectively. The traveling blocks 164 are laterally slidable on opposing sides of a central plate 166 mounted in the center of the covering cavity 36f.

Still referring to FIGS. 12–14, a central cable 168 is anchored at its ends to the plate 166, extends around a pulley 170 fixed to each traveling block 164, and returns to the central plate 166. After then passing over a pair of pulleys 172, 174 on each side, the cable 168 passes around a single central pulley 176, which is not mounted to the plate 166, as are pulleys 172 and 174. Instead, the central pulley 176 is mounted upon a control rod 180 which extends vertically downwardly from a retraction mechanism actuator 181, such as a conventional pneumatic cylinder 182. It should be understood that other types of retraction mechanism actuators may instead be used with the present invention, such as hydraulic or electric, rotary or linear motion transfer devices. Further, the cables 160, 168 may be selected among various suitable commercially available cables, such as steel wire cable, and the various pulleys may be selected among a variety of suitable commercially available pulleys.

The central pulley 176 moves vertically by the movement, or reciprocation, of the control rod 180 in response to the application or release of pneumatic pressure within the cylinder 182, which may be supplied through air input and outlet hoses, 184, 186 (FIG. 1) with valves (not shown), or other mechanisms (not shown), as known in the art. The pneumatic cylinder 182, or other actuator 181, may be controlled or actuated with any suitable conventional switch, circuitry or other device. As the central pulley 176 moves upwardly or downwardly, the cable 168 will draw the travelling blocks 164 in the direction of the central plate 166. In turn, cables 160 will be drawn in the direction of the covering 36 (FIG. 12), retracting the expandable portions 120.

In the configuration of the expandable portion retraction mechanism 156 illustrated in FIGS. 12–14, the traveling blocks 164 will provide a mechanical advantage of two, enabling the retraction mechanism 156 to efficiently overcome the force of the springs 150. For example, to retract expandable portions 120 that extend about 2½ inches into the chambers 14, the pneumatic cylinder 182 may be actuated to drive the control rod 180 and central pulley 176 downwardly a distance of 5 inches. This movement will cause each traveling block 164 to move laterally about 2½ inches via the central cable 168, which will draw the cables 160 and panels 124 inwardly about 2½ inches. Thus, the expandable portions 120 may be selectively retracted with the use of the retraction mechanism 156. The expandable portions 120 can be maintained in retracted position by maintaining the necessary pneumatic pressure in the pneumatic cylinder 182. Finally, when the covering 36 is moved into the closed position, pneumatic pressure in the cylinder 182 may be released to allow the expandable portion expansion mechanism 149 to expand the expandable portion 120.

Preferably, the covering, or door, 36 is also equipped with one or more sealing members to help seal the opening 30 during use of the device 10. As shown in FIG. 9a, for example, a conventional inflatable silicone rubber seal 190 may be disposed on the inside surface 36e of the covering 36 around each expandable portion 120 to engage, or seal, the covering 36 against insulation or other components (not shown) of the device 10. Further, suitable conventional insulation (not shown) may be included within the interior 36f of the door 36 to assist maintaining a controlled environment within the chambers 14.

While the preferred embodiment as described above includes expansion mechanisms 149 for expanding the expandable portions 120 and a separate retraction mechanism 156 for retracting the expandable portions 120, a single mechanism (not shown) can be used to both expand and retract the expandable portion 120, such as with the use of inflatable or piston driven expandable portions. Further, the expansion and retraction mechanisms 149, 156 or single expansion/retraction mechanism may take any form and configuration suitable for use with the covering 36 of the present invention.

While preferred embodiments of the present invention have been shown and described, modifications thereof can be made by one skilled in the art without departing from the spirit or teachings of this invention. The embodiments described herein are exemplary only and are not limiting. Many variations and modifications of this system and apparatus are possible and are within the scope of the invention. Accordingly, the scope of protection is not limited to the embodiments described herein.

What is claimed is:

1. An apparatus having at least one environmentally controllable chamber, the chamber having an opening and a treatment space, comprising:

a chamber opening covering movable between at least one open position and a closed position relative to the opening, wherein the open position of said chamber opening covering allows at least partial access to the chamber through the opening, a chamber opening covering actuator, and said chamber opening covering including at least one expandable portion, wherein said expandable portion is expandable into the treatment space of the chamber when said chamber opening covering is in the closed position.

2. The apparatus of claim 1 wherein said expandable portion is capable of substantially occupying the space inside the chamber adjacent said chamber opening covering when said chamber opening covering is in the closed position and said expandable portion is expanded.

3. The apparatus of claim 1 wherein said chamber opening covering includes first and second adjacent expandable portions.

4. The apparatus of claim 1 wherein said chamber opening covering is moveable upwardly into an open position and downwardly into a closed position.

5. The apparatus of claim 1 wherein said chamber opening covering has at least two open positions.

6. The apparatus of claim 5 wherein said chamber allows burning-in integrated circuit packages disposed on burn-in boards, further including a burn-in board seating device.

7. The apparatus of claim 1 wherein said chamber opening covering actuator includes a motor, at least one chain guide rotatable by said motor, and at least one chain engageable with said chain guide and said chamber opening covering.

8. The apparatus of claim 7 further including a shaft rotatable by said motor and a counterbalance spring associated with said shaft.

9. The apparatus of claim 1 wherein said expandable portion includes a face member and at least two side hinge members.

10. The apparatus of claim 9 wherein said side hinge member includes three hinges.

11. The device of claim 1 wherein said expandable portion is inflatable.

12. The apparatus of claim 1 further including an expandable portion expansion mechanism having at least one resilient urging member.

13. The apparatus of claim 1 further including an expandable portion expansion mechanism having at least one piston.

14. The apparatus of claim 1 wherein said chamber opening covering is moveable into four open positions.

15. The apparatus of claim 1 further including an expandable portion retraction mechanism.

16. The apparatus of claim 15 wherein said expandable portion retraction mechanism includes at least one cord-like member connected with said expandable portion, said cord-like member being moveable by a retraction mechanism actuator.

17. The apparatus of claim 1 further including at least one guide member capable of assisting in maintaining alignment of said chamber opening covering with the chamber.

18. A device for occupying treatment space in a burn-in chamber between at least one burn-in board disposed in the chamber and an access opening to the chamber, comprising:

a door movable between at least one open position and a closed position relative to the opening, and at least one expandable portion disposed on said door, wherein said expandable portion is expandable into the chamber and capable of substantially occupying the treatment space inside the chamber adjacent said door when said door is in the closed position.

19. The apparatus of claim 18 wherein said door is moveable upwardly into an open position and downwardly into a closed position.

20. The apparatus of claim 18 further including a burn-in board seating device.

21. The apparatus of claim 20 wherein said burn-in board seating device is connected with said door.

22. The apparatus of claim 18 further including a door actuator including a motor, at least one chain guide rotatable by said motor, and at least one chain engageable with said chain guide and said door.

23. The apparatus of claim 22 further including a shaft rotatable by said motor and a counterbalance spring associated with said shaft.

24. The apparatus of claim 18 wherein said expandable portion includes a face member and at least two side hinge members.

25. The apparatus of claim 18 further including an expandable portion expansion mechanism having at least one resilient urging member.

26. The apparatus of claim 18 further including an expandable portion expansion mechanism having at least one piston.

27. The apparatus of claim 18 further including an expandable portion retraction mechanism including at least one cord-like member connected with said expandable portion, said cord-like member being moveable by a retraction mechanism actuator.

28. An apparatus having at least one environmentally controllable chamber, the chamber having a treatment space and an opening, comprising;

means for covering the chamber opening, said means for covering being movable between at least one open position and a closed position relative to the opening, means for moving said means for covering between at least one open position and a closed position relative to the opening, and expandable means connected with said covering means, wherein said expandable means is expandable into the treatment space of the chamber when said means for covering is in the closed position.

\* \* \* \* \*